(12) United States Patent
Jung et al.

(10) Patent No.: US 11,961,571 B2
(45) Date of Patent: Apr. 16, 2024

(54) SEMICONDUCTOR MEMORY DEVICE DETECTING PROGRAM FAILURE, AND METHOD OF OPERATING THE SAME

(71) Applicant: SK hynix Inc., Gyeonggi-do (KR)

(72) Inventors: Jae Yeop Jung, Gyeonggi-do (KR); Sung Hyun Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/370,725

(22) Filed: Jul. 8, 2021

(65) Prior Publication Data

US 2022/0230694 A1      Jul. 21, 2022

(30) Foreign Application Priority Data

Jan. 19, 2021      (KR) .......................... 10-2021-0007394

(51) Int. Cl.
*G11C 16/34*      (2006.01)
*G11C 16/08*      (2006.01)
*G11C 16/10*      (2006.01)
*G11C 16/26*      (2006.01)

(52) U.S. Cl.
CPC .......... *G11C 16/3459* (2013.01); *G11C 16/08* (2013.01); *G11C 16/102* (2013.01); *G11C 16/26* (2013.01); *G11C 16/3495* (2013.01)

(58) Field of Classification Search
CPC ... G11C 16/0483; G11C 16/08; G11C 16/102; G11C 16/26; G11C 16/34; G11C 16/3436; G11C 16/3454; G11C 16/3459; G11C 16/3495

USPC ........................................ 365/185.17, 185.22
See application file for complete search history.

(56) References Cited

U.S. PATENT DOCUMENTS

| | | | | |
|---|---|---|---|---|
| 2009/0154244 | A1* | 6/2009 | Shiga | G11C 29/028 |
| | | | | 365/185.11 |
| 2020/0202963 | A1* | 6/2020 | Ko | H10B 43/27 |
| 2022/0189569 | A1* | 6/2022 | Kato | G11C 16/10 |

FOREIGN PATENT DOCUMENTS

| | | |
|---|---|---|
| KR | 10-2018-0062158 A | 6/2018 |
| KR | 10-2019-0115765 A | 10/2019 |
| KR | 10-2020-0079113 A | 7/2020 |

* cited by examiner

Primary Examiner — Alfredo Bermudez Lozada
(74) Attorney, Agent, or Firm — IP & T GROUP LLP

(57) ABSTRACT

Provided herein are a semiconductor memory device and a method of operating the same. The semiconductor memory device may include a memory cell array, a peripheral circuit, and a control logic. The memory cell array may include a plurality of memory cells. The peripheral circuit may perform a program operation on selected memory cells coupled to a selected word line among the plurality of memory cells. The control logic may control the program operation of the peripheral circuit. The program operation may include a plurality of program loops. Each of the program loops may include a program phase and a verify phase. The verify phase may include one or more verify operations. The control logic may be further configured to count a number of the verify operations performed by the peripheral circuit in the verify phase included in one of the plurality of program loops during the program operation.

20 Claims, 15 Drawing Sheets

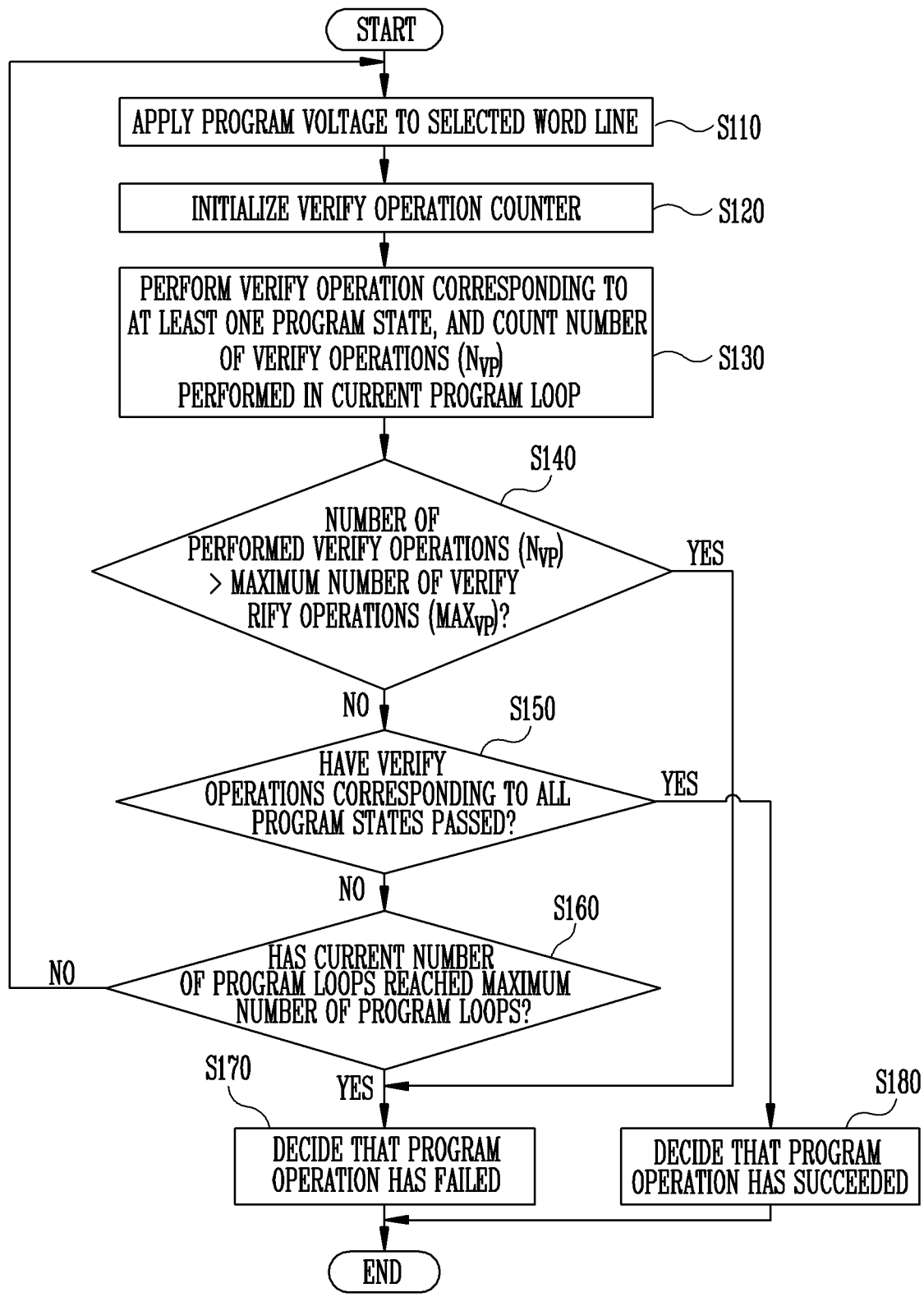

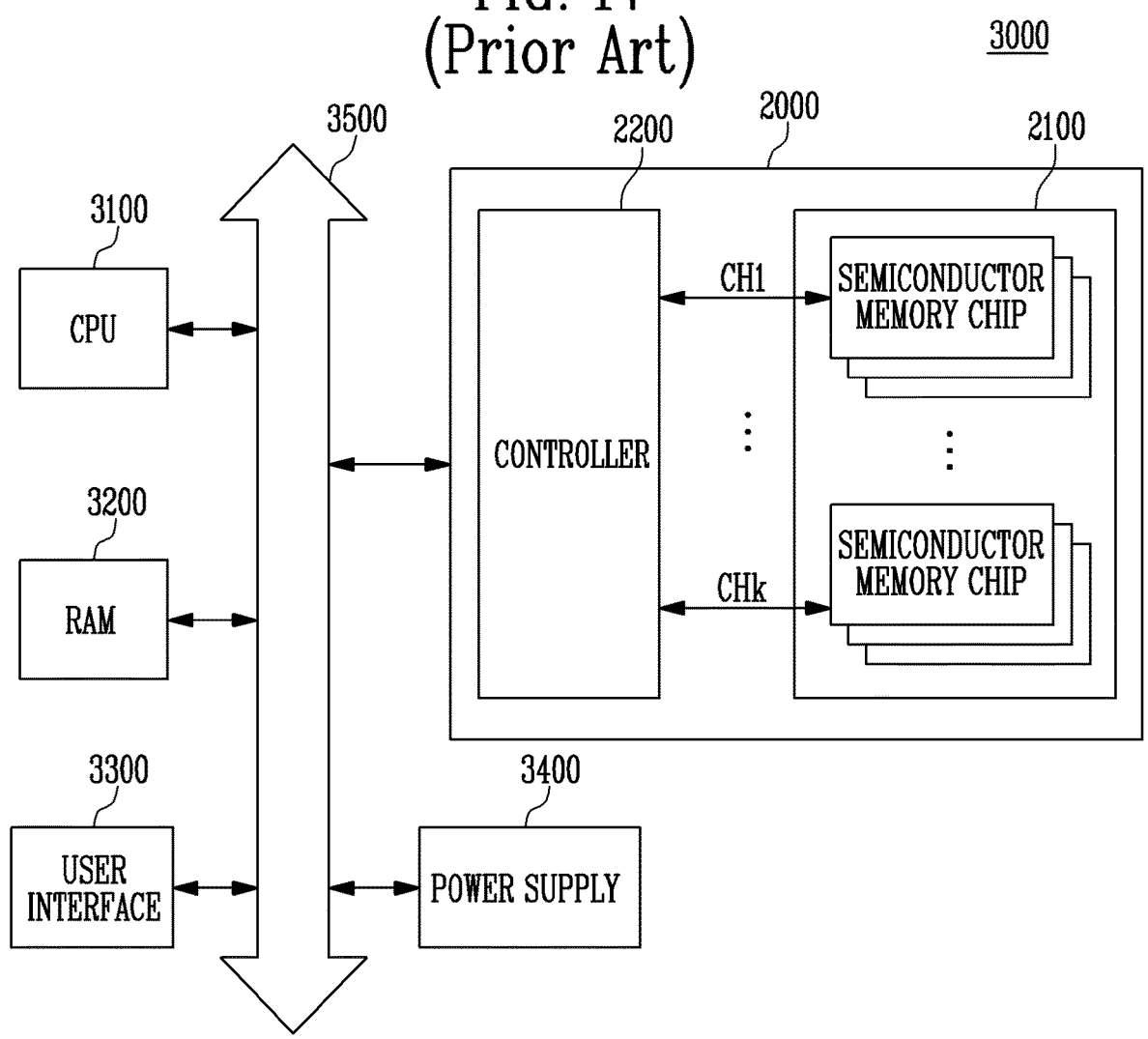

SEMICONDUCTOR MEMORY DEVICE DETECTING PROGRAM FAILURE, AND METHOD OF OPERATING THE SAME

CROSS-REFERENCE TO RELATED APPLICATION

The present application claims priority under 35 U.S.C. § 119(a) to Korean patent application number 10-2021-0007394 filed on Jan. 19, 2021, which is incorporated herein by reference in its entirety.

BACKGROUND

1. Technical Field

Various embodiments of the present disclosure generally relate to an electronic device, and more particularly to a semiconductor memory device and a method of operating the semiconductor memory device.

2. Related Art

A semiconductor memory device may have a two-dimensional (2D) structure in which strings are horizontally arranged on a semiconductor substrate. Alternatively, the semiconductor memory device may have a three-dimensional (3D) structure in which strings are vertically stacked on a semiconductor substrate. Since the memory device having a 2D structure is reaching its physical scaling limit (i.e., limit in the degree of integration), a 3D memory device including a plurality of memory cells vertically stacked on a semiconductor substrate has been produced.

SUMMARY

Various embodiments of the present disclosure are directed to a semiconductor memory device, which may enhance the reliability of a program operation, and a method of operating the semiconductor memory device.

An embodiment of the present disclosure may provide for a semiconductor memory device. The semiconductor memory device may include a memory cell array, a peripheral circuit, and a control logic. The memory cell array may include a plurality of memory cells. The peripheral circuit may be configured to perform a program operation on selected memory cells coupled to a selected word line among the plurality of memory cells. The control logic may be configured to control the program operation of the peripheral circuit. The program operation may include a plurality of program loops. Each of the plurality of program loops may include a program phase and a verify phase. The verify phase may include one or more verify operations. The control logic may be further configured to count a number of the verify operations performed by the peripheral circuit in the verify phase included in one of the plurality of program loops during the program operation.

An embodiment of the present disclosure may provide for a method of operating a semiconductor memory device including a plurality of memory cells. The method may include performing a program operation of programming memory cells coupled to a selected word line among the plurality of memory cells. The program operation includes a plurality of program loops and each of the plurality of program loops may include applying a program voltage to the selected word line, performing one or more verify operations respectively corresponding to one or more program states on memory cells coupled to the selected word line and counting a number of the verify operations that are performed.

An embodiment of the present disclosure may provide for a semiconductor memory device. The semiconductor memory device may include a memory cell array, a peripheral circuit, and a control logic. The memory cell array may include a plurality of memory cells. The peripheral circuit may be configured to perform a program operation on selected memory cells coupled to a selected word line among the plurality of memory cells. The control logic may be configured to control the program operation of the peripheral circuit. The program operation may include a plurality of program loops. Each of the plurality of program loops may include a program phase and a verify phase. The verify phase may include one or more verify operations. The control logic may include a verify operation counter, a maximum-number-of-verify-operations storage, and an excessive verify operation detector. The verify operation counter may be configured to count a number of verify operations performed by the peripheral circuit in one of the plurality of program loops during the program operation. The maximum number-of-verify operations storage may be configured to store a maximum number of verify operations. The excessive verify operation detector may be configured to compare the number of the verify operations performed in the program loop with the maximum number of verify operations, and determine whether the program operation has succeeded based on a result of the comparison.

An embodiment of the present disclosure may provide for a method of operating a semiconductor memory device. The method may include performing a program operation of one or more loop operations on selected memory cells, each of the loop operations being configured by a program voltage application operation and one or more verify operations respectively for one or more target program states, and determining the program operation as failed when a number of the verify operations within one of the loop operations becomes greater than a threshold.

BRIEF DESCRIPTION OF THE DRAWINGS

FIG. 12 is a flowchart illustrating a method of operating a semiconductor memory device according to an embodiment of the present disclosure.

FIG. 17 is a block diagram illustrating a computing system including the memory system described with reference to FIG. 16.

DETAILED DESCRIPTION

Specific structural or functional descriptions in the embodiments of the present disclosure introduced in this specification or application are disclosed to describe embodiments according to the concept of the present disclosure. The embodiments according to the concept of the present disclosure may be practiced in various forms, and should not be construed as being limited to the embodiments described in the specification.

Figure 1:
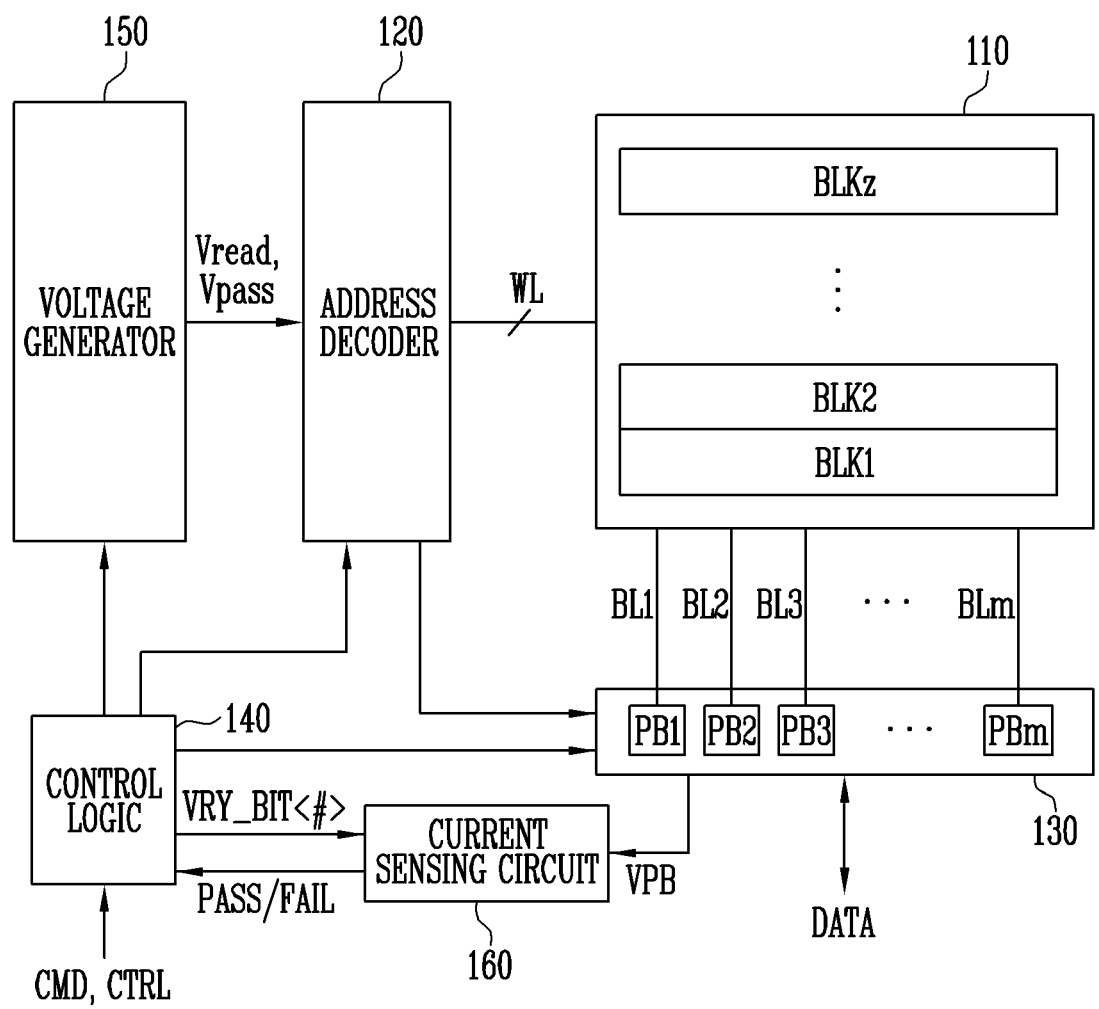
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 includes a memory cell array 110, an address decoder 120, a read and write circuit 130, a control logic 140, a voltage generator 150, and a current sensing circuit 160.

The memory cell array 110 may include a plurality of memory blocks BLK1 to BLKz. The memory blocks BLK1 to BLKz are coupled to the address decoder 120 through word lines WL. The memory blocks BLK1 to BLKz are coupled to the read and write circuit 130 through bit lines BL1 to BLm. Each of the memory blocks BLK1 to BLKz includes a plurality of memory cells. In an embodiment, the plurality of memory cells may be nonvolatile memory cells, and may be implemented as nonvolatile memory cells having a vertical channel structure. The memory cell array 110 may be implemented as a memory cell array having a two-dimensional (2D) structure. In an embodiment, the memory cell array 110 may be implemented as a memory cell array having a three-dimensional (3D) structure. Furthermore, each of the memory cells included in the memory cell array may store at least one bit of data. In an embodiment, each of the memory cells included in the memory cell array 110 may be a single-level cell (SLC), which stores 1-bit data. In an embodiment, each of the memory cells included in the memory cell array 110 may be a multi-level cell (MLC), which stores 2-bit data. In an embodiment, each of the memory cells included in the memory cell array 110 may be a triple-level cell (TLC), which stores 3-bit data. In an embodiment, each of the memory cells included in the memory cell array 110 may be a quad-level cell (QLC), which stores 4-bit data. In accordance with an embodiment, the memory cell array 110 may include a plurality of memory cells each of which stores 5 or more bits of data.

The address decoder 120 is coupled to the memory cell array 110 through the word lines WL. The address decoder 120 may be operated under the control of the control logic 140. The address decoder 120 receives addresses through an input/output buffer (not illustrated) provided in the semiconductor memory device 100.

The address decoder 120 may decode a block address, among the received addresses. The address decoder 120 selects at least one memory block based on the decoded block address. Further, when a read voltage apply operation is performed during a read operation, the address decoder 120 may apply a read voltage Vread, generated by the voltage generator 150, to a selected word line of a selected memory block, and may apply a pass voltage Vpass to remaining word lines, that is, unselected word lines. Further, during a program verify operation, the address decoder 120 may apply a verify voltage, generated by the voltage generator 150, to the selected word line of the selected memory block, and may apply the pass voltage Vpass to the remaining word lines, that is, unselected word lines.

The address decoder 120 may decode a column address, among the received addresses. The address decoder 120 may transmit the decoded column address to the read and write circuit 130.

The read and program operations of the semiconductor memory device 100 are each performed on a page basis. Addresses received in response to requests for the read and program operations may include a block address, a row address, and a column address. The address decoder 120 may select one memory block and one word line in accordance with the block address and the row address. The column address may be decoded by the address decoder 120, and may then be provided to the read and write circuit 130. In the present specification, memory cells coupled to one word line may be referred to as a "physical page."

The read and write circuit 130 includes a plurality of page buffers PB1 to PBm. The read and write circuit 130 may be operated as a "read circuit" during a read operation of the memory cell array 110 and as a "write circuit" during a write operation thereof. The plurality of page buffers PB1 to PBm are coupled to the memory cell array 110 through the bit lines BL1 to BLm. In order to sense threshold voltages of the memory cells during a read operation and a program verify operation, each of the page buffers PB1 to PBm may sense, through a sensing node, a change in the amount of flowing current depending on the program state of a corresponding memory cell and latch the sensed change as sensing data while continuously supplying sensing current to the bit lines coupled to the memory cells. The read and write circuit 130 is operated in response to page buffer control signals output from the control logic 140. In the present specification, a write operation of the write circuit may be used as having the same meaning as a program operation performed on selected memory cells.

During a read operation, the read and write circuit 130 may sense data stored in the memory cells and temporarily store read data, and may then output data DATA to the input/output buffer (not illustrated) of the semiconductor memory device 100. In an embodiment, the read and write circuit 130 may include a column select circuit or the like as well as the page buffers (or page registers).

The control logic 140 may be coupled to the address decoder 120, the read and write circuit 130, and the current sensing circuit 160. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. The control logic 140 may output a control signal for controlling a precharge potential level at the sensing node of the plurality of page buffers PB1 to PBm. The control logic 140 may control the read and write circuit 130 to perform a read operation of the memory cell array 110.

Moreover, the control logic 140 may determine whether a verify operation corresponding to a specific target program state has passed or failed in response to a pass or fail signal PASS or FAIL received from the current sensing circuit 160.

The voltage generator 150 may generate the read voltage Vread and the pass voltage Vpass for a read operation in response to the control signal output from the control logic 140. The voltage generator 150 may include a plurality of pumping capacitors for receiving the internal supply voltage to generate a plurality of voltages having various voltage levels, and may generate a plurality of voltages by selectively enabling the plurality of pumping capacitors under the control of the control logic 140.

During a verify operation, the current sensing circuit 160 may generate a reference current in response to the enable bit VRY_BIT<#> received from the control logic 140, and may compare a reference voltage, generated by the reference current, with a sensing voltage VPB, received from the page buffer PB1 to PBm included in the read and write circuit 130, and then output a pass signal PASS or a fail signal FAIL.

The address decoder 120, the read and write circuit 130, the voltage generator 150, and the current sensing circuit 160 may function as peripheral circuits which perform a read operation, a write operation, and an erase operation on the memory cell array 110. The peripheral circuits may perform a read operation, a write operation, and an erase operation on the memory cell array 110 under the control of the control logic 140.

In accordance with an embodiment of the present disclosure, during the program operation of the semiconductor memory device 100, the control logic 140 may count the number of verify operations (i.e., a verify operation count) performed in each program loop, and may compare a counted number with the set maximum number of verify operations (i.e., a set maximum verify operation count). The control logic 140 may determine a program fail when the number of verify operations performed in the program loop is greater than the maximum number of verify operations. In contrast, the control logic 140 may control the peripheral circuit so that the process proceeds to a subsequent program loop when the number of verify operations performed in the program loop is less than or equal to the maximum number of verify operations. Accordingly, the case where the program fails due to the defect in the selected word line, which may cause the increment of the threshold voltages higher than the intended values, may be anticipatively detected.

Figure 2:
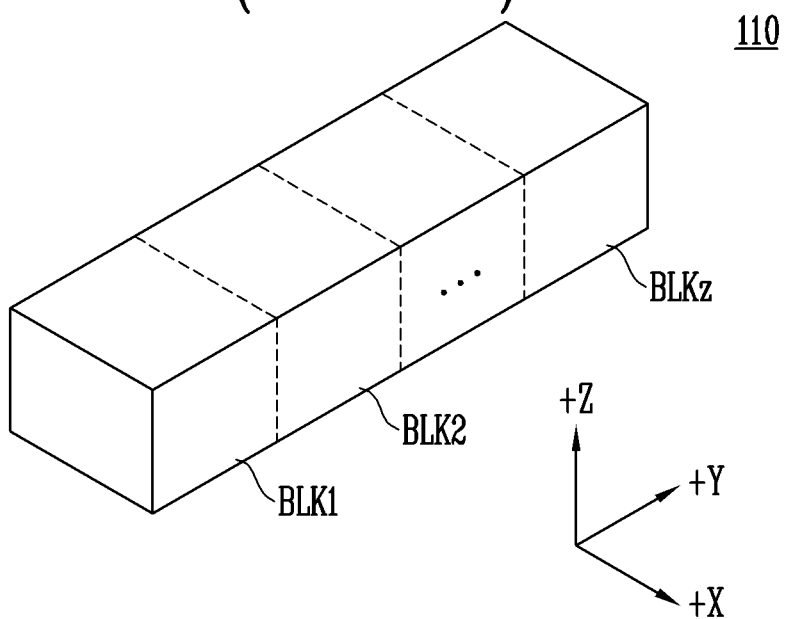
FIG. 2 is a diagram illustrating a memory cell array of FIG. 1 according to an embodiment of the present disclosure.

FIG. 2 is a block diagram illustrating the memory cell array 110 of FIG. 1 according to an embodiment of the present disclosure.

Referring to FIG. 2, the memory cell array 110 includes a plurality of memory blocks BLK1 to BLKz. Each memory block has a three-dimensional (3D) structure. Each of the memory blocks may include a plurality of memory cells stacked on a substrate. The plurality of memory cells are arranged in +X, +Y, and +Z directions. The structure of each memory block will be described in more detail below with reference to FIGS. 3 and 4.

Figure 3:
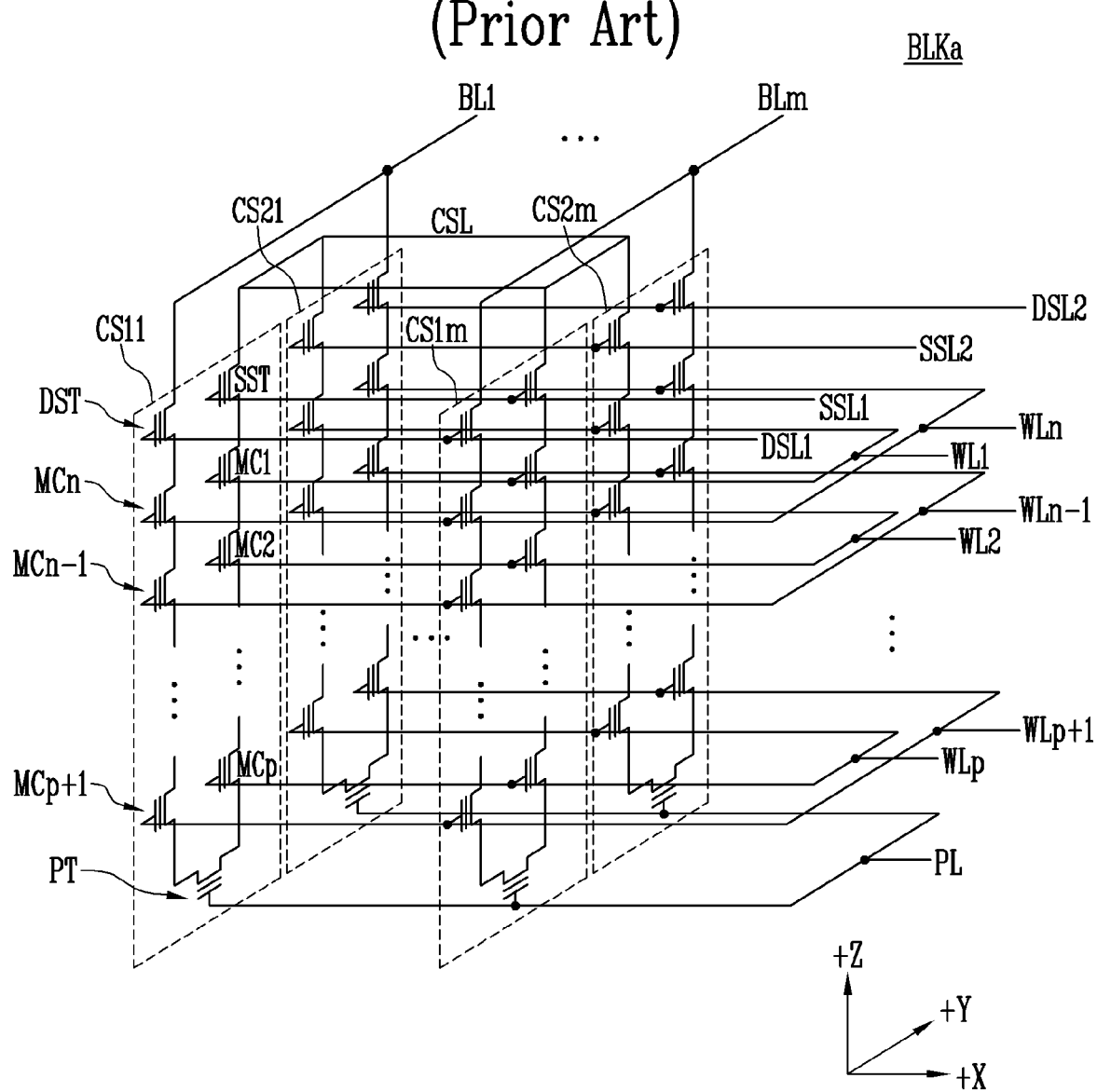
FIG. 3 is a circuit diagram illustrating a memory block BLKa of memory blocks BLK1 to BLKz of FIG. 2 according to an embodiment of the present disclosure.

FIG. 3 is a circuit diagram illustrating a memory block BLKa of memory blocks BLK1 to BLKz of FIG. 2 according to an embodiment of the present disclosure.

Referring to FIG. 3, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e., a positive (+) X direction). In FIG. 3, two cell strings are illustrated as being arranged in a column direction (i.e., a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 3, source select transistors of the cell strings CS11 to CS1m in a first row are coupled to a first source select line SSL1. Source select transistors of the cell strings CS21 to CS2m in a second row are coupled to a second source select line SSL2.

In an embodiment, source select transistors of the cell strings CS11 to CS1m and CS21 to CS2m may be coupled in common to one source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite to a positive (+) Z direction and are coupled in series between the source select transistor SST and the pipe transistor PT. The p+1-th to n-th memory cells MCp+1 to MCn are sequentially arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. Gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 3, the cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. Cell strings arranged in the direction of a single row may be selected by selecting one of the drain select lines DSL1 and DSL2. One page may be selected from the selected cell strings by selecting one of the word lines WL1 to WLn.

In an embodiment, instead of the first to m-th bit lines BL1 to BLm, even bit lines and odd bit lines may be provided. Even-numbered cell strings, among the cell strings CS11 to CS1m or CS21 to CS2m arranged in a row direction, may be coupled to respective even bit lines. Odd-numbered cell strings, among the cell strings CS11 to CS1m or CS21 to CS2m arranged in the row direction, may be coupled to respective odd bit lines.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As the number of dummy memory cells that are provided is increased, the reliability of operation of the memory block BLKa may be improved, whereas the size of the memory block BLKa may be increased. As the number of dummy memory cells that are provided is decreased, the size of the memory block BLKa may be decreased, whereas the reliability of operation of the memory block BLKa may be deteriorated.

To efficiently control the one or more dummy memory cells, respective dummy memory cells may have required threshold voltages. Before or after an erase operation on the memory block BLKa is performed, program operations may be performed on all or some of the dummy memory cells. When the erase operation is performed after the program operations have been performed, the respective dummy memory cells may have required threshold voltages by controlling voltages to be applied to dummy word lines coupled to respective dummy memory cells.

Figure 4:
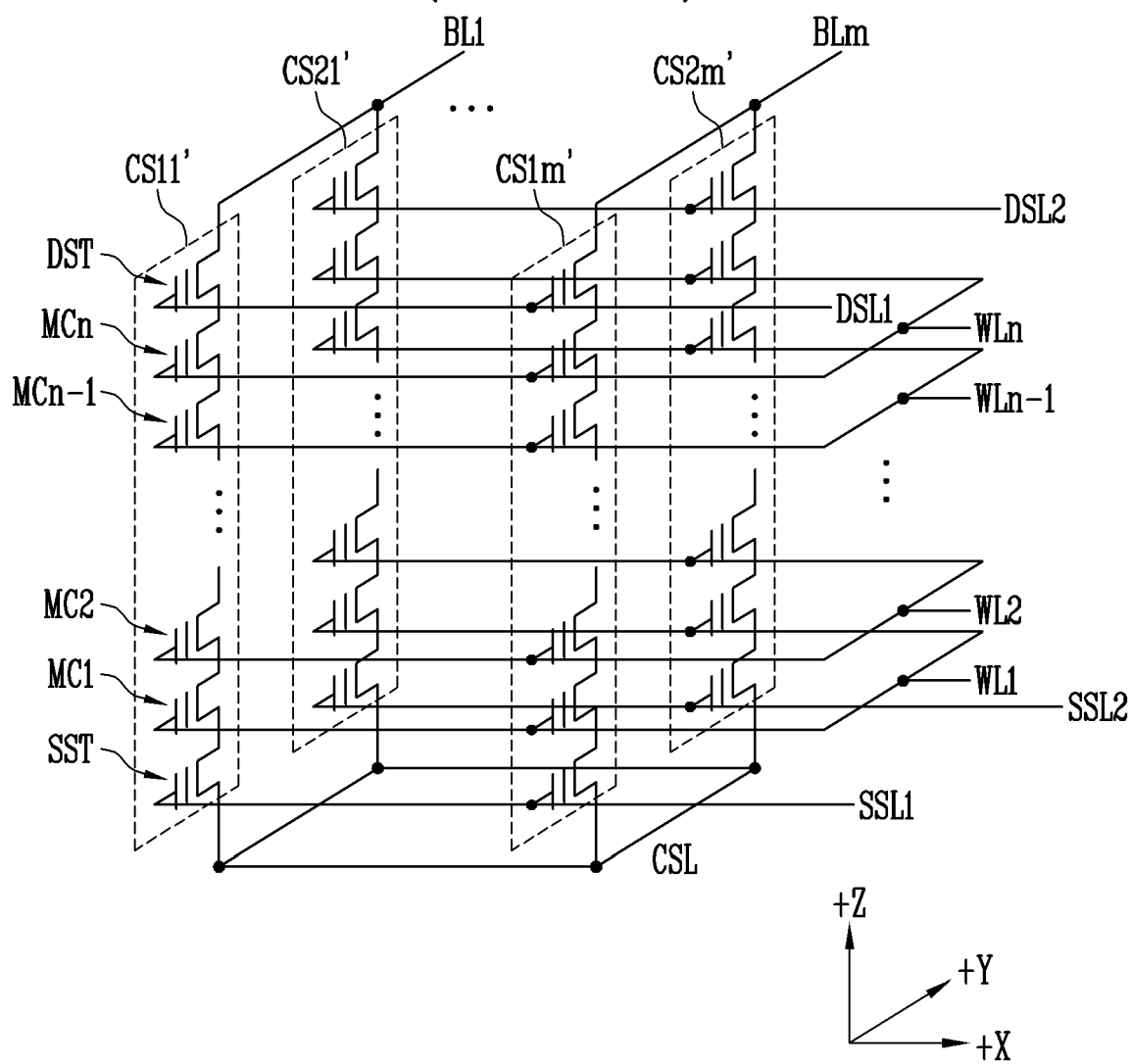
FIG. 4 is a circuit diagram illustrating an example of a memory block BLKb of the memory blocks BLK1 to BLKz of FIG. 2 according to an embodiment of the present disclosure.

FIG. 4 is a circuit diagram illustrating an example of a memory block BLKb of the memory blocks BLK1 to BLKz of FIG. 2 according to an embodiment of the present disclosure.

Referring to FIG. 4, the memory block BLKb may include a plurality of cell strings CS11' to CS1m' and CS21' to CS2m'. Each of the plurality of cell strings CS11' to CS1m' and CS21' to CS2m' extends along a positive Z (+Z) direction. Each of the cell strings CS11' to CS1m' and CS21' to CS2m' may include at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 4 has an equivalent circuit similar to that of the memory block BLKa of FIG. 3 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer memory cells are provided, the size of the memory block BLKb is reduced, but the reliability of the operation of the memory block BLKb may be deteriorated.

To efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the dummy memory cells may have required threshold voltages by controlling the voltages to be applied to the dummy word lines coupled to respective dummy memory cells.

Figure 5:
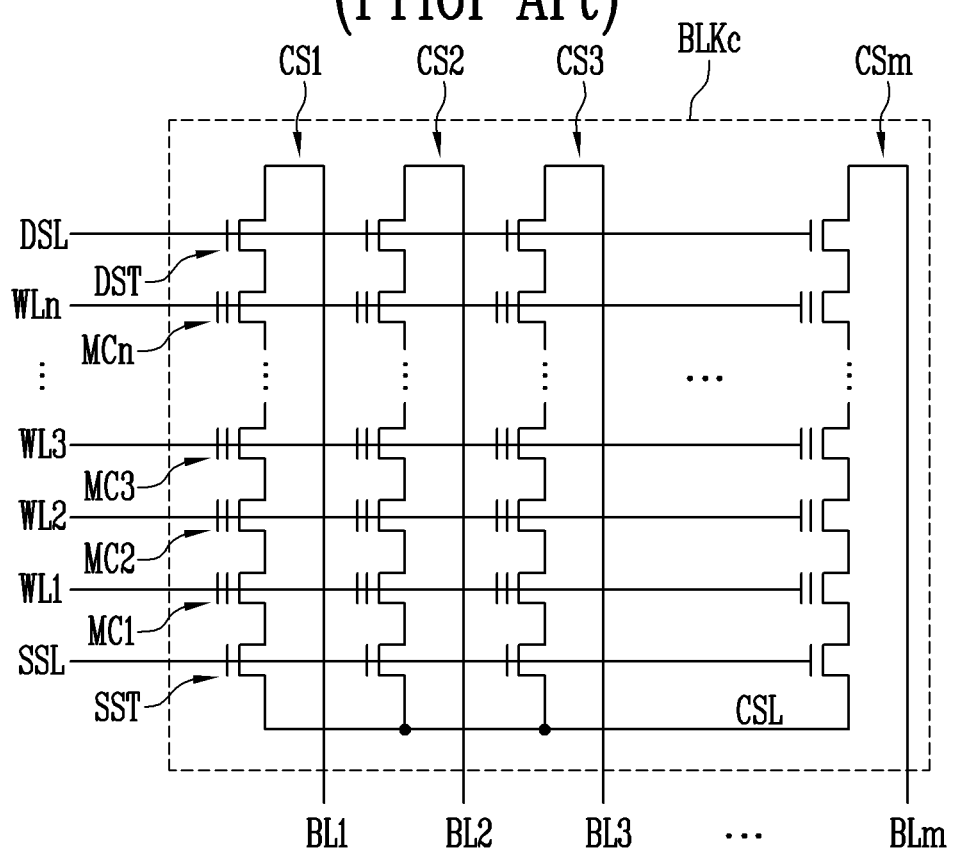
FIG. 5 is a circuit diagram illustrating an example of a memory block BLKc of the memory blocks BLK1 to BLKz included in the memory cell array 110 of FIG. 1 according to an embodiment of the present disclosure.

FIG. 5 is a circuit diagram illustrating an example of a memory block BLKc of the memory blocks BLK1 to BLKz included in the memory cell array 110 of FIG. 1 according to an embodiment of the present disclosure.

Referring to FIG. 5, the memory block BLKc may include a plurality of cell strings CS1 to CSm. The plurality of cell strings CS1 to CSm may be coupled to a plurality of bit lines BL1 to BLm, respectively. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

The memory cells coupled to the same word line may constitute a single page. The cell strings CS1 to CSm may be selected by selecting the drain select line DSL. One page may be selected from the selected cell strings by selecting one of the word lines WL1 to WLn.

In other embodiments, even bit lines and odd bit lines may be provided instead of the first to m-th bit lines BL1 to BLm. Among the cell strings CS1 to CSm, even-numbered cell strings may be coupled to the even bit lines, respectively, and odd-numbered cell strings may be coupled to the odd bit lines, respectively.

As described above, memory cells coupled to one word line may form one physical page. In the example of FIG. 5, among memory cells belonging to the memory block BLKc, m memory cells coupled to one of the plurality of word lines WL1 to WLn forms one physical page.

The memory cell array 110 of the semiconductor memory device 100 may be configured in a 3D structure, as illustrated in FIG. 2 to 4, or may be configured in a 2D structure, as illustrated in FIG. 5.

Figure 6:
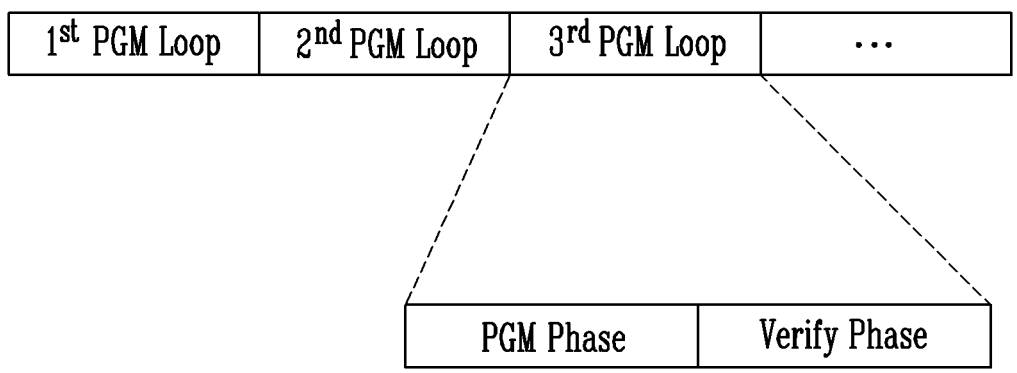
FIG. 6 is a diagram illustrating a plurality of program loops included in a program operation and a program phase and a verify phase included in each program loop according to an embodiment of the present disclosure.

FIG. 6 is a diagram illustrating a plurality of program loops included in a program operation and a program phase and a verify phase included in each program loop according to an embodiment of the present disclosure.

Referring to FIG. 6, the program operation may include a plurality of program loops. As illustrated in FIG. 6, the program operation may be initiated by performing a first program loop (1$^{st}$ PGM Loop). When the program operation performed on selected memory cells is not completed even if the first program loop (1$^{st}$ PGM Loop) has been performed, a second program loop (2$^{nd}$ PGM Loop) may be performed. When the program operation on the selected memory cells is not completed even if the second program loop (2$^{nd}$ PGM Loop) has been performed, a third program loop (3$^{rd}$ PGM Loop) may be performed. In this manner, the program loops may be repeatedly performed until the program operation is completed.

However, when the program operation is not completed even if a number of program loops identical to the set maximum number of program loops have been repeated, it may be determined that the program operation has failed.

Figure 7:
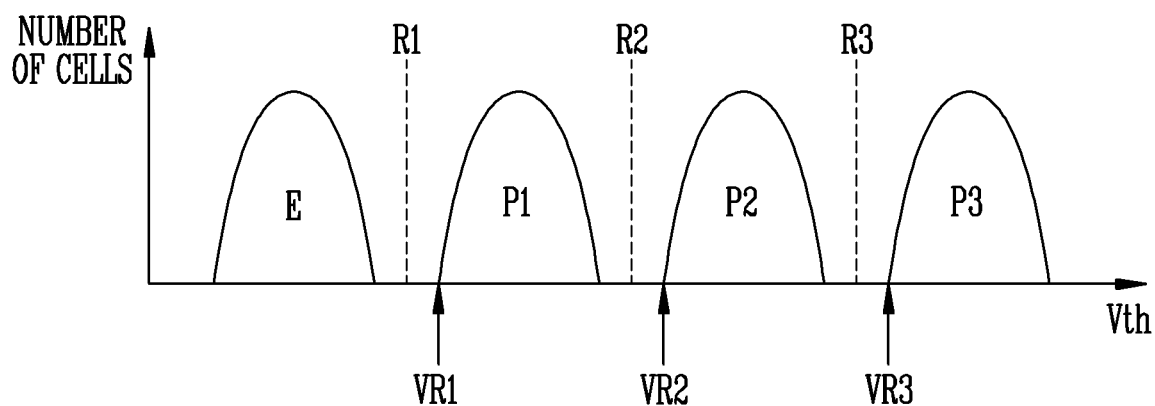
FIG. 7 is a graph illustrating threshold voltage distributions of multi-level cells (MLC).

FIG. 7 is a graph illustrating threshold voltage distributions of multi-level cells (MLC) according to an embodiment of the present disclosure. In an embodiment of the present disclosure, the memory cells included in the memory cell array 110 of FIG. 1 may include multi-level cells having threshold voltage distributions illustrated in FIG. 7.

Referring to FIG. 7, threshold voltage distributions of multi-level cells, each of which stores 2 bits of data, are illustrated. Each of the multi-level cells may have a threshold voltage corresponding to one of an erased state E, a first program state P1, a second program state P2, and a third program state P3. Therefore, in order to read the data stored in a multi-level cell, a first read voltage R1, a second read voltage R2, and a third read voltage R3 may be used.

During the program operation, the first verify voltage VR1 may be used to verify the threshold voltages of memory cells to be programmed to the first program state P1. Furthermore, the second verify voltage VR2 may be used to verify the threshold voltages of memory cells to be programmed to the second program state P2. Finally, the third verify voltage VR3 may be used to verify the threshold voltages of memory cells to be programmed to the third program state P3.

Figure 8:
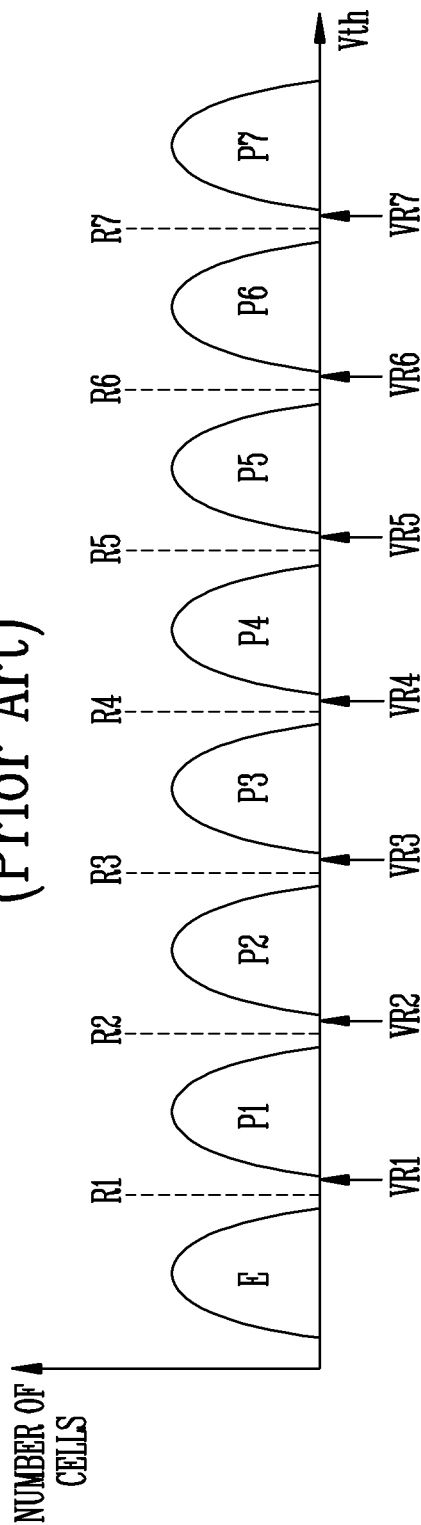
FIG. 8 is a graph illustrating threshold voltage distributions of triple-level cells (TLC).

FIG. 8 is a graph illustrating threshold voltage distributions of triple-level cells (TLC) according to an embodiment of the present disclosure. In an embodiment of the present disclosure, memory cells included in the memory cell array 110 of FIG. 1 may include triple-level cells having threshold voltage distributions illustrated in FIG. 8.

Referring to FIG. 8, triple-level cells (TLC) have a total of eight threshold voltage states. The threshold voltage states of the triple-level cells (TLC) include an erased state E and first to seventh target program states P1 to P7.

As illustrated in FIG. 8, respective threshold voltage states may be identified based on the first to seventh read voltages R1 to R7. Also, during the program operation, the first to seventh verify voltages VR1 to VR7 may be respectively used to determine whether programming of memory cells corresponding to the program states P1 to P7 has been completed.

In FIGS. 7 and 8, the target program states of multi-level cells and triple-level cells are illustrated. However, this is only an example, and the memory cell array 110 may include quad-level cells (QLC) in other embodiments of the present disclosure. Hereinafter, the present disclosure will be described based on a program operation performed on triple-level cells (TLC). However, the present disclosure is not limited thereto, and the present disclosure may also be applied to programming of multi-level cells, quad-level cells, or memory cells which store 5 or more bits of data.

Figure 9:
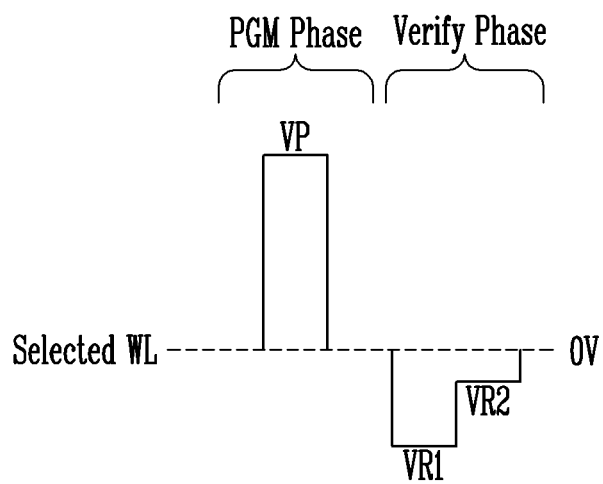
FIG. 9 is a diagram illustrating a program voltage applied in a program phase and verify voltages applied in a verify phase according to an embodiment of the present disclosure.

FIG. 9 is a diagram illustrating a program voltage applied in a program phase and verify voltages applied in a verify phase according to an embodiment of the present disclosure.

Referring to FIG. 9, voltages applied to a selected word line in one of a plurality of program loops are illustrated. In the program phase included in the program loop, a program voltage VP is applied to the selected word line. In the verify phase included in the program loop, at least one verify voltage may be applied to the selected word line. In FIG. 9, an embodiment in which a first verify voltage VR1 and a second verify voltage VR2 are sequentially applied to the selected word line in the verify phase is illustrated. In FIG. 9, an embodiment in which the first verify voltage VR1 and the second verify voltage VR2 are negative voltages is illustrated. However, this is only an example, and the first verify voltage VR1 and the second verify voltage VR2 may be positive voltages.

In FIG. 9, only voltages applied to the selected word line are depicted, and an illustration of voltages applied to unselected word lines is omitted. Although not illustrated in FIG. 9, a program pass voltage may be applied to unselected word lines in the program phase, and a verify pass voltage may be applied to the unselected word lines in the verify phase. The program pass voltage may be a voltage less than the program voltage VP. The verify pass voltage may be a voltage greater than the first verify voltage VR1 and the second verify voltage VR2.

Figure 10:
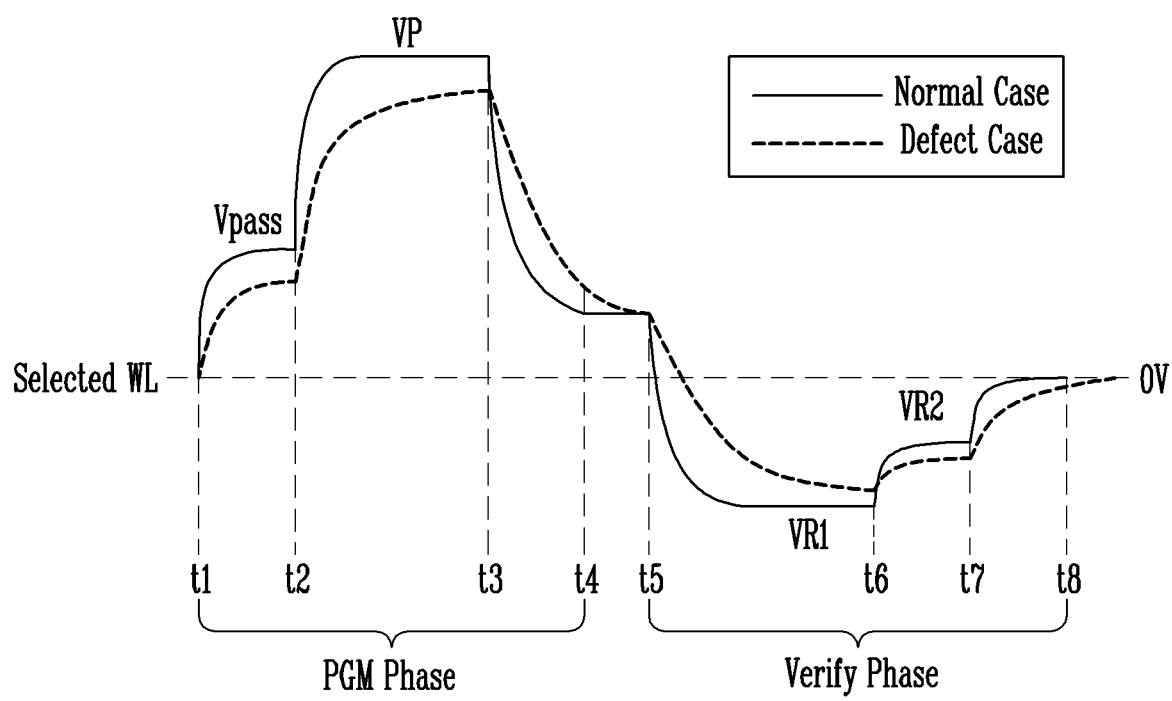
FIG. 10 is a diagram illustrating in detail the program voltage and the verify voltages of FIG. 9 according to an embodiment of the present disclosure.

FIG. 10 is a diagram illustrating in detail the program voltage and the verify voltages of FIG. 9 according to an embodiment of the present disclosure.

Referring to FIG. 10, a voltage applied to a selected word line in a normal case is indicated by a solid line, and a voltage applied to a selected word line in a defect case is indicated by a dotted line. First, a program operation that is performed in the normal case will be described below.

At time t1, a program pass voltage Vpass may be applied to the selected word line. Here, the program pass voltage Vpass may also be applied to unselected word lines. Thereafter, at time t2, a program voltage VP may be applied to the selected word line. Here, the voltages of the unselected word lines may be maintained at the program pass voltage Vpass. Until time t3, the program voltage VP applied to the selected word line may be maintained. Accordingly, during a period from time t2 to time t3, the threshold voltages of memory cells coupled to bit lines to which a program-permission voltage is applied, among memory cells coupled to the selected word line, may increase. During the period from time t2 to time t3, the threshold voltages of memory cells coupled to bit lines to which a program-inhibition voltage is applied, among memory cells coupled to the selected word line, may not increase.

At time t3, the voltage of the selected word line starts to decrease. Further, at time t4, a decrease in the voltage of the selected word line may be finished. Accordingly, the program phase of one program loop is completed. That is, as illustrated in FIG. 10, a period from time t1 to time t4 may correspond to the program phase illustrated in FIG. 6.

Thereafter, at time t5, the verify phase is initiated. Accordingly, at time t5, the voltage of the selected word line may decrease to the first verify voltage VR1. During a period from time t5 to time t6, a verify operation may be performed on memory cells to be programmed to a first program state P1. Thereafter, at time t6, the voltage of the selected word line may increase to the second verify voltage VR2. During a period from time t6 to time t7, a verify operation may be performed on memory cells to be programmed to a second program state P2. Thereafter, the voltage of the selected word line starts to increase at time t7, and may increase up to a reference voltage e.g., a ground voltage (0 V) at time t8. Accordingly, at time t8, the verify phase is terminated.

In FIG. 10, an embodiment in which only the verify operations corresponding to the first program state P1 and the second program state P2 are performed respectively through the first and second verify voltages VR1 and VR2 in one program loop is illustrated. However, as the program loop is repeated, the target of the verify operation to be performed in the verify phase may be changed. When a verify operation corresponding to the first program state P1 has been completed in a specific program loop, a verify operation corresponding to the first program state P1 may not be performed in a subsequent program loop. When the set program loop is reached, a verify operation corresponding to a third program state P3 may be newly performed. The program loops in which verify operations corresponding to respective program states are to be performed may be set. This will be described in detail later with reference to FIGS. 14A and 14B.

As indicated by the solid line in FIG. 10, in the normal case, the voltage of the selected word line rapidly changes, and thus the program operation may be desirably performed. However, in the defect case, the resistance of the word line increases, and thus the program operation may not be desirably performed. That is, when the resistance of the selected word line increases due to the resistive defect of the selected word line, the rising speed of the voltage of the selected word line decreases, as indicated by the dotted line in FIG. 10. Accordingly, the rising speed of the threshold voltages of the selected memory cells may decrease, and thus the number of repetitions of the program loop may increase. This may be the cause of decreasing the overall program speed.

Further, in the first program state P1 which is a lower state corresponding to a negative verify voltage, the time required to stabilize the voltage of the word line is insufficient, and thus the level of the actually applied verify voltage may increase. It can be seen that, during the period from time t5 to time t6 of FIG. 10, the actually applied verify voltage in the defect case is greater than that in the normal case. This indicates that verification of the memory cells on which the program operation has been normally completed based on the first verify voltage VR1 is determined to have failed. Therefore, the total number of repetitions of the program loops may increase. In typical cases, when programming of the memory cells to be programmed to the highest program state, that is, a seventh program state P7 in the case of a TLC, has been completed, it may be determined that the entire program operation has passed.

Therefore, the program operation is recognized as having passed based on the seventh program state P7, but the threshold voltages of memory cells corresponding to the first program state P1 may also increase due to the effect of increasing the first verify voltage VR1, thus resulting in a read failure in a subsequent read operation.

In accordance with the semiconductor memory device 100 and a method of operating the semiconductor memory device 100 according to embodiments of the present disclosure, during a program operation, the control logic 140 may count the number of verify operations performed in each program loop, and may compare the counted number with the set maximum number of verify operations. The control logic 140 may determine that the program operation has failed when the number of verify operations in each program loop is greater than the maximum number of verify operations. In contrast, the control logic 140 may control the peripheral circuit so that the process proceeds to a subsequent program loop when the number of verify operations in the program loop is less than or equal to the maximum number of verify operations. Accordingly, the case where the program fails due to a defect in the selected word line, which may cause the increment of the threshold voltages higher than the intended values, may be anticipatively detected.

Figure 11:
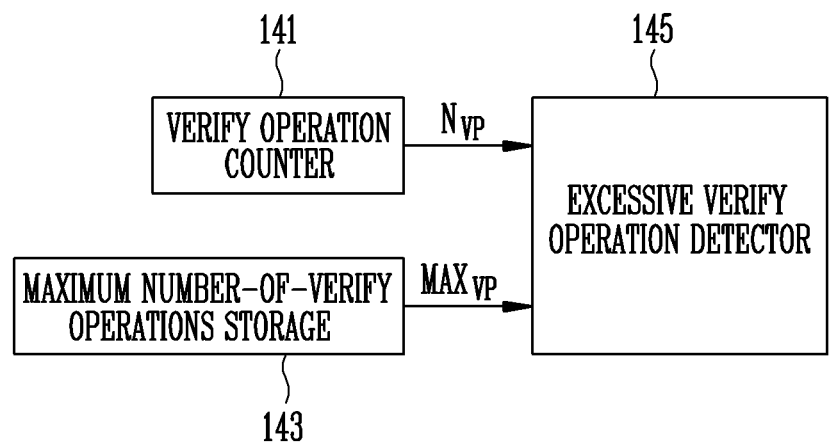
FIG. 11 is a diagram illustrating the control logic 140 illustrated in FIG. 1 according to an embodiment of the present disclosure.

FIG. 11 is a diagram illustrating the control logic 140 illustrated in FIG. 1 according to an embodiment of the present disclosure.

Referring to FIG. 11, the control logic 140 may include a verify operation counter 141, a maximum-number-of-verify-operations storage 143, and an excessive verify operation detector 145. The verify operation counter 141 may count the number $N_{VP}$ of verify operations performed in each program loop. The verify operation counter 141 may transfer the number $N_{VP}$ of verify operations performed in each program loop to the excessive verify operation detector 145. The maximum-number-of-verify-operations storage 143 may store the set maximum number $MAX_{VP}$ of verify operations (i.e., a maximum verify operation count). The maximum-number-of-verify-operations storage 143 may transfer the maximum number $MAX_{VP}$ of verify operations to the excessive verify operation detector 145. The excessive verify operation detector 145 compares the number $N_{VP}$ of verify operations performed in each program loop with the maximum number $MAX_{VP}$ of verify operations. When the number $N_{VP}$ of verify operations performed in the current program loop is greater than the maximum number $MAX_{VP}$ of verify operations, the excessive verify operation detector 145 may determine that the program operation including the current program loop has failed. When the number $N_{VP}$ of verify operations performed in the current program loop is less than the maximum number $MAX_{VP}$ of verify operations, the excessive verify operation detector 145 may determine that a subsequent program loop is to be performed.

FIG. 12 is a flowchart illustrating a method of operating a semiconductor memory device according to an embodiment of the present disclosure.

Referring to FIG. 12, by the method of operating the semiconductor memory device according to the embodiment of the present disclosure, memory cells coupled to a selected word line may be programmed.

At operation S110, a program voltage VP may be applied to the selected word line. Accordingly, threshold voltages of memory cells coupled to bit lines to which a program-permission voltage is applied, among memory cells coupled to the selected word line, may increase. That is, operation S110 may correspond to a program phase performed during a period from time t1 to time t4 illustrated in FIG. 10.

At operation S120, the value of the verify operation counter 141 may be initialized. This corresponds to an operation of initializing a value counted in a previous program loop to count the number of verify operations performed in each program loop. In an embodiment, operation S120 may be performed prior to operation S110. In other embodiments, after operation S140 has been performed, operation S120 may be performed.

At operation S130, a verify operation corresponding to a program state may be performed, and the number $N_{VP}$ of verify operations performed in the current program loop may be counted. In accordance with the embodiment illustrated in FIG. 10, a verify operation using a first verify voltage VR1 and a second verify voltage VR2 is performed during a period from time t5 to time t8. Accordingly, at operation S130, verify operations corresponding to a first program state P1 and a second program state P2 may be performed. The number $N_{VP}$ of verify operations counted at operation S130 may be 2. At operation S130, the number $N_{VP}$ of verify operations performed in the current program loop may be counted by the verify operation counter 141 of FIG. 11.

At operation S140, whether the number $N_{VP}$ of verify operations performed in the current program loop is greater than the maximum number $MAX_{VP}$ of verify operations may be determined. Operation S140 may be performed by the excessive verify operation detector 145 of FIG. 11. When the number $N_{VP}$ of verify operations performed in the current program loop is greater than the maximum number $MAX_{VP}$ of verify operations, it means that excessive verify operations have been performed in the current program loop, compared to a normal case represented by the maximum number $MAX_{VP}$ of verify operations. Therefore, the process may proceed to operation S170, where it may be decided that the program operation currently being performed has failed.

If it is determined at operation S140 that the number $N_{VP}$ of verify operations performed in the current program loop is less than or equal to the maximum number $MAX_{VP}$ of verify operations, it may be considered that the verify operations correspond to those in the normal case. In this case, the process proceeds to operation S150. At operation S150, whether verify operations corresponding to all program states P1 to P7 have passed may be determined. When it is determined that the verify operations corresponding to all program states P1 to P7 have passed, the process may proceed to operation S180, where it is decided that the program operation has succeeded.

When it is determined at operation S150 that the verify operations corresponding to all program states P1 to P7 have not passed, the process proceeds to operation S160.

At operation S160, whether the current number of program loops (i.e., a current program loop count) has reached the maximum number of program loops (i.e., a maximum program loop count) is determined. When the current program loop count has reached the maximum program loop count, the process proceeds to operation S170, where it is decided that the program operation has failed.

When it is determined at operation S160 that the current program loop count does not reach the maximum program loop count, there is a need to perform a subsequent program loop. Therefore, the process returns to operation S110, where a subsequent program loop is performed. Here, the number of program loops (program loop count) may be increased by 1. Referring to FIG. 12, it can be seen that operations S110 to S160 may constitute a single program loop.

As illustrated in FIG. 12, the method of operating the semiconductor memory device according to an embodiment of the present disclosure may include the operation S140 of comparing the number $N_{VP}$ of verify operations performed in the current program loop, among the program loops, with the maximum number $MAX_{VP}$ of verify operations. Accordingly, when it is determined that the number $N_{VP}$ of verify operations performed in the current program loop is greater than the maximum number $MAX_{VP}$ of verify operations (in the case of Yes at operation S140), it is decided that the program operation currently being performed has failed. Accordingly, the case where the program fails due to a defect in the selected word line, which may cause the increment of the threshold voltages higher than the intended values, may be anticipatively detected.

Figure 13A:
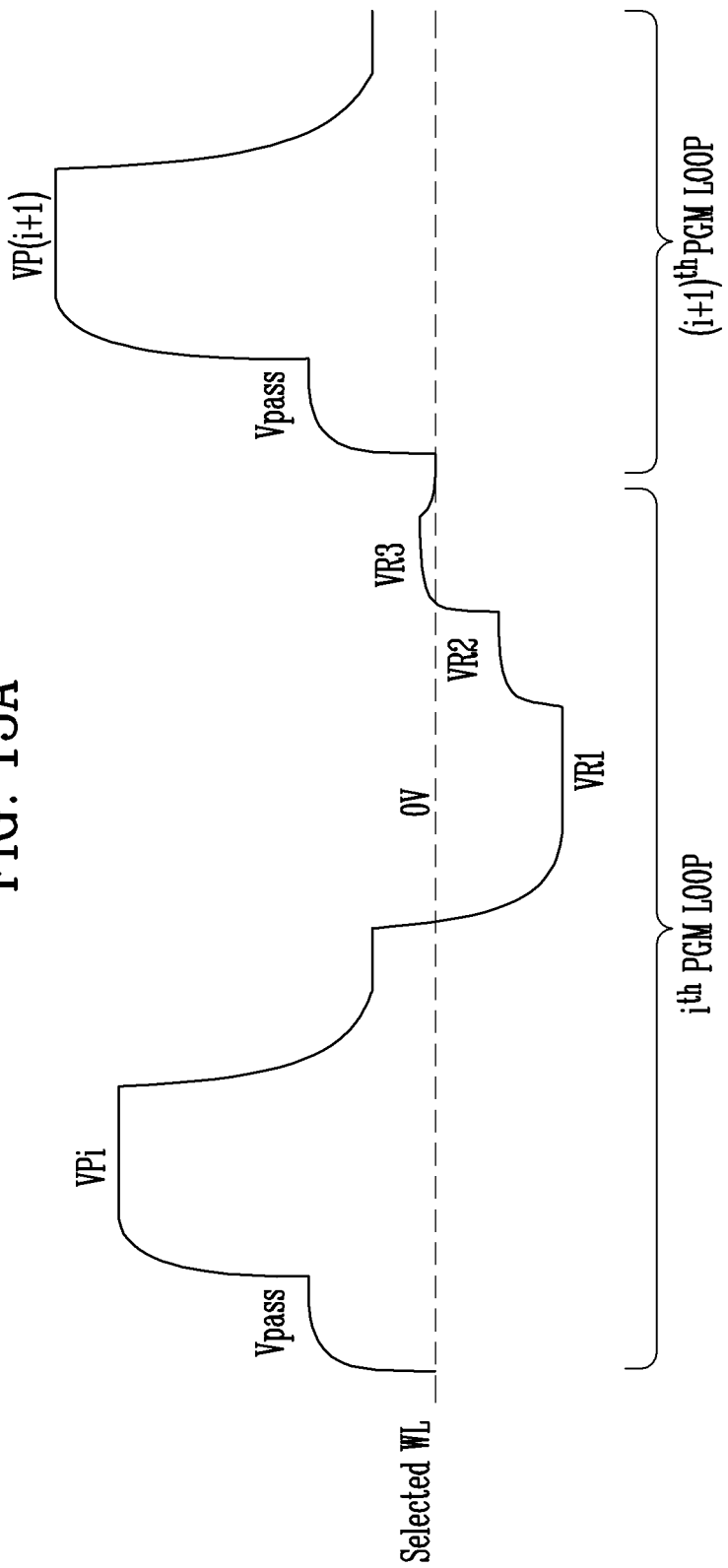
FIGS. 13A and 13B are diagrams illustrating a method of operating a semiconductor memory device according to an embodiment of the present disclosure.
Figure 13B:
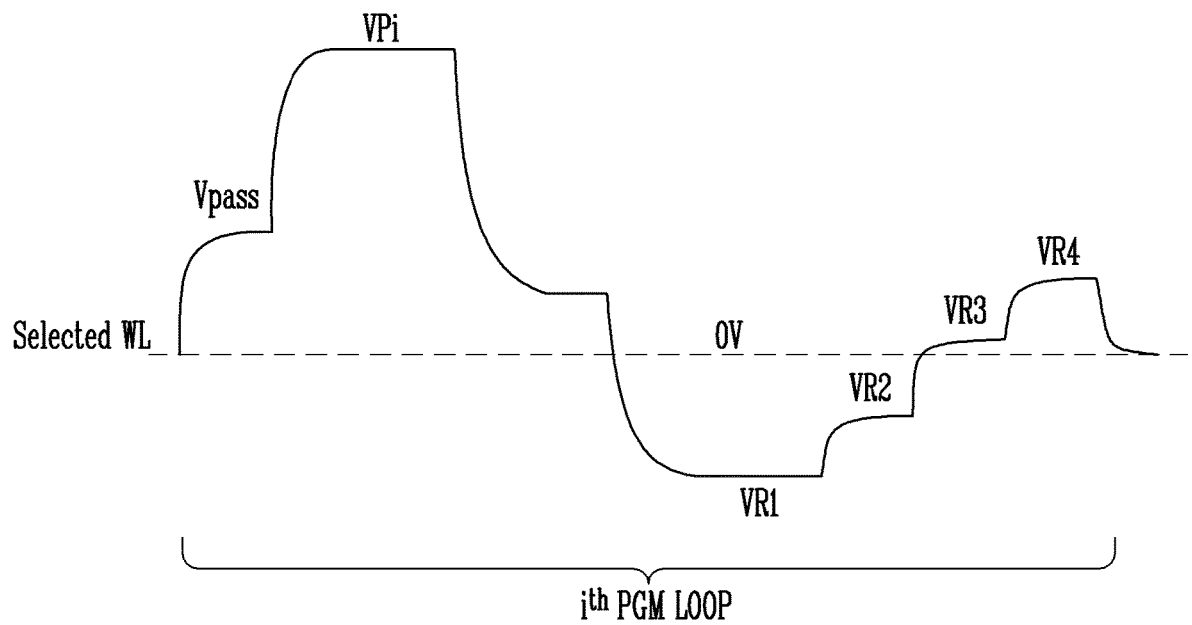

FIGS. 13A and 13B are diagrams illustrating a method of operating a semiconductor memory device according to an embodiment of the present disclosure. In FIG. 13A, the case where the number $N_{VP}$ of verify operations performed in an i-th program loop ($i^{th}$ PGM LOOP) is not greater than the maximum number $MAX_{VP}$ of verify operations is illustrated, and in FIG. 13B, the case where the number $N_{VP}$ of verify operations performed in the i-th program loop ($i^{th}$ PGM LOOP) is greater than the maximum number $MAX_{VP}$ of verify operations is illustrated. For the illustration thereof, a description will be made based on the maximum number $MAX_{VP}$ of verify operations being "3".

Referring to FIG. 13A, an i-th program voltage VPi is first applied to a selected word line in the i-th program loop ($i^{th}$ PGM LOOP). Thereafter, in a verify phase, a first verify voltage VR1, a second verify voltage VR2, and a third verify voltage VR3 are used. That is, in the i-th program loop ($i^{th}$ PGM LOOP), verify operations corresponding to a first program state P1, a second program state P2, and a third program state P3 are respectively performed. That is, in the example of FIG. 13A, the number $N_{VP}$ of verify operations performed in the i-th program loop ($i^{th}$ PGM LOOP) is 3. Since the number $N_{VP}$ (=3) of verify operations performed in the i-th program loop ($i^{th}$ PGM LOOP) is not greater than the maximum number $MAX_{VP}$ (=3) of verify operations, a subsequent program loop, that is, an (i+1)-th program loop ((i+1)th PGM LOOP) may be performed. Although not illustrated in FIG. 13A, a verify operation may also be performed after an (i+1)-th program voltage VP(i+1) has been applied.

Referring to FIG. 13B, an i-th program voltage VPi is first applied to a selected word line in an i-th program loop ($i^{th}$ PGM LOOP). Thereafter, in a verify phase, a first verify voltage VR1, a second verify voltage VR2, a third verify voltage VR3, and a fourth verify voltage VR4 are used. That is, in the i-th program loop ($i^{th}$ PGM LOOP), verify operations corresponding to a first program state P1, a second program state P2, a third program state P3, and a fourth program state P4 are respectively performed. That is, in the example of FIG. 13B, the number $N_{VP}$ of verify operations performed in the i-th program loop ($i^{th}$ PGM LOOP) is 4. Since the number $N_{VP}$ (=4) of verify operations performed in the i-th program loop ($i^{th}$ PGM LOOP) is greater than the maximum number $MAX_{VP}$ (=3) of verify operations, a subsequent program loop is not performed, and it may be determined that the program operation has failed.

Figure 14A:
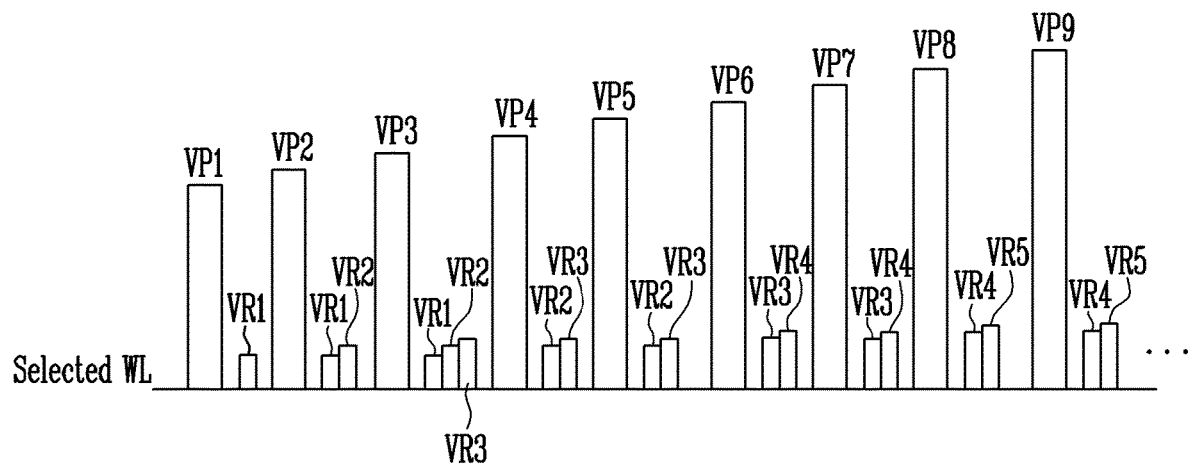
FIGS. 14A and 14B are diagrams illustrating a method of operating a semiconductor memory device according to an embodiment of the present disclosure.
Figure 14B:
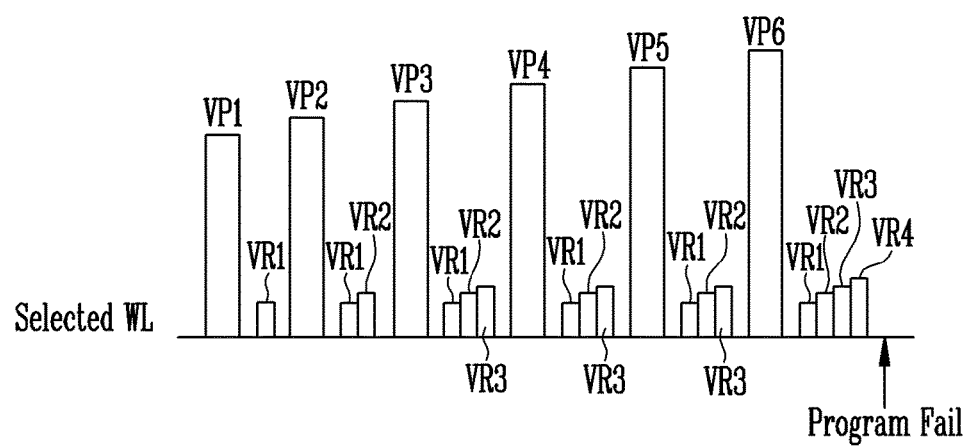

FIGS. 14A and 14B are diagrams illustrating a method of operating a semiconductor memory device according to an embodiment of the present disclosure.

Referring to FIG. 14A, an embodiment is illustrated in which a verify operation corresponding to a first program state P1 starts in a first program loop, a verify operation corresponding to a second program state P2 starts in a second program loop, a verify operation corresponding to a third program state P3 starts in a third program loop, a verify operation corresponding to a fourth program state P4 starts in a sixth program loop, and a verify operation corresponding to a fifth program state P5 starts in an eighth program loop.

Accordingly, it can be seen that a first program voltage VP1 and a first verify voltage VR1 are applied to the selected word line in the first program loop. In the second program loop, a second program voltage VP2, the first verify voltage VR1, and a second verify voltage VR2 are applied to the selected word line. In the third program loop, a third program voltage VP3, the first verify voltage VR1, the second verify voltage VR2, and a third verify voltage VR3 are applied to the selected word line.

In FIG. 14A, verification for the first program state P1 has passed in the third program loop. Accordingly, from the fourth program loop, the first verify voltage VR1 is not applied to the selected word line.

In this way, in the example illustrated in FIG. 14A, the number of verify operations performed in each program loop does not exceed 3. Accordingly, it can be seen that subsequent program loops are successively performed.

Referring to FIG. 14B, similar to the example of FIG. 14A, an embodiment is illustrated in which a verify operation corresponding to a first program state P1 starts in a first program loop, a verify operation corresponding to a second program state P2 starts in a second program loop, a verify operation corresponding to a third program state P3 starts in a third program loop, a verify operation corresponding to a fourth program state P4 starts in a sixth program loop, and a verify operation corresponding to a fifth program state P5 starts in an eighth program loop.

Accordingly, it can be seen that a first program voltage VP1 and a first verify voltage VR1 are applied to a selected word line in the first program loop. In the second program loop, a second program voltage VP2, the first verify voltage VR1, and a second verify voltage VR2 are applied to the selected word line. In the third program loop, a third program voltage VP3, the first verify voltage VR1, the second verify voltage VR2, and a third verify voltage VR3 are applied to the selected word line.

It can be seen that, unlike FIG. 14A, in accordance with an illustration in FIG. 14B, verification for the first program state P1 has not passed in the third program loop. Accordingly, even in the fourth program loop, the first verify voltage VR1 is applied to the selected word line. Therefore, verification for the first program state P1 has not passed even in the fourth program loop, and thus the first verify voltage VR1 is applied to the selected word line even in the fifth program loop. Furthermore, verification for the first program state P1 has not passed even in the fifth program loop, and thus the first verify voltage VR1 is applied to the selected word line even in the sixth program loop.

Furthermore, it can be seen that, unlike FIG. 14A, in accordance with an illustration in FIG. 14B, verification for the second program state P2 has not passed in the fifth program loop. Accordingly, even in the sixth program loop, the second verify voltage VR2 is applied to the selected word line.

Consequently, in the sixth program loop, the first to fourth verify voltages VR1 to VR4 are applied to the selected word line. That is, the number $N_{VP}$ of verify operations performed in the sixth program loop is 4, which is greater than the maximum number $MAX_{VP}$ of verify operations, that is, 3. Accordingly, the excessive verify operation detector 145 of FIG. 11 may determine that the program operation currently being performed has failed.

Figure 15:
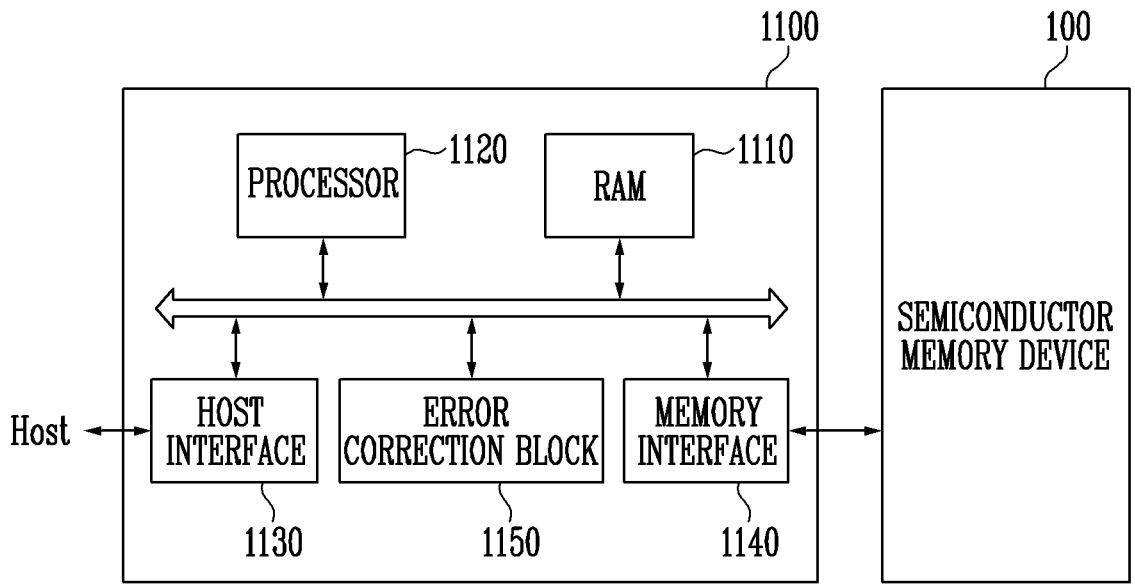
FIG. 15 is a block diagram illustrating a memory system including the semiconductor memory device of FIG. 1 according to an embodiment of the present disclosure.

FIG. 15 is a block diagram illustrating of a memory system including the semiconductor memory device of FIG. 1 according to an embodiment of the present disclosure.

Referring to FIG. 15, the memory system 1000 may include the semiconductor memory device 100 and a controller 1100. The semiconductor memory device 100 may be the semiconductor memory device described with reference to FIG. 1. Hereinafter, repetitive descriptions will be omitted.

The controller 1100 is coupled to a host Host and the semiconductor memory device 100. The controller 1100 may access the semiconductor memory device 100 in response to a request from the host Host. For example, the controller 1100 may control read, write, erase, and background operations of the semiconductor memory device 100. The controller 1100 may provide an interface between the semiconductor memory device 100 and the host Host. The controller 1100 may run instructions, e.g., firmware for controlling the semiconductor memory device 100.

The controller 1100 includes a random access memory (RAM) 1110, a processor 1120, a host interface 1130, a memory interface 1140, and an error correction block 1150. The RAM 1110 is used as at least one of a working memory for the processor 1120, a cache memory between the semiconductor memory device 100 and the host Host, and a buffer memory between the semiconductor memory device 100 and the host Host. The processor 1120 may control the overall operation of the controller 1100. In addition, the controller 1100 may temporarily store program data provided from the host Host during a write operation.

The host interface 1130 includes a protocol for performing data exchange between the host Host and the controller 1100. In an embodiment, the controller 1100 may communicate with the host Host through at least one of various communication standards or interfaces, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface may include a NAND interface or NOR interface.

The error correction block 1150 may detect and correct errors in data received from the semiconductor memory device 100 using an error correction code (ECC). The processor 1120 may adjust the read voltage based on the result of error detection by the error correction block 1150, and may control the semiconductor memory device 100 to perform re-reading. In an embodiment, the error correction block may be provided as an element of the controller 1100.

The controller 1100 and the semiconductor memory device 100 may be integrated into a single semiconductor device. In an embodiment, the controller 1100 and the semiconductor memory device 100 may be integrated into a single semiconductor device to form a memory card. For example, the controller 1100 and the semiconductor memory device 100 may be integrated into a single semiconductor device to form a memory card, such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The controller 1100 and the semiconductor memory device 100 may be integrated into a single semiconductor device to form a solid state drive (SSD). The SSD includes a storage device configured to store data in a semiconductor memory. When the memory system 1000 is used as the SSD, an operation speed of the host Host coupled to the memory system 1000 may be remarkably improved.

In an embodiment, the memory system 1000 may be provided as one of various elements of an electronic device such as a computer, an ultra mobile PC (UMPC), a workstation, a net-book, a personal digital assistant (PDA), a portable computer, a web tablet, a wireless phone, a mobile phone, a smartphone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, a radio frequency identification (RFID) device, or one of various elements for forming a computing system.

In an embodiment, the semiconductor memory device 100 or the memory system 1000 may be mounted in various types of packages. For example, the semiconductor memory device 100 or the memory system 1000 may be packaged and mounted in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

Figure 16:
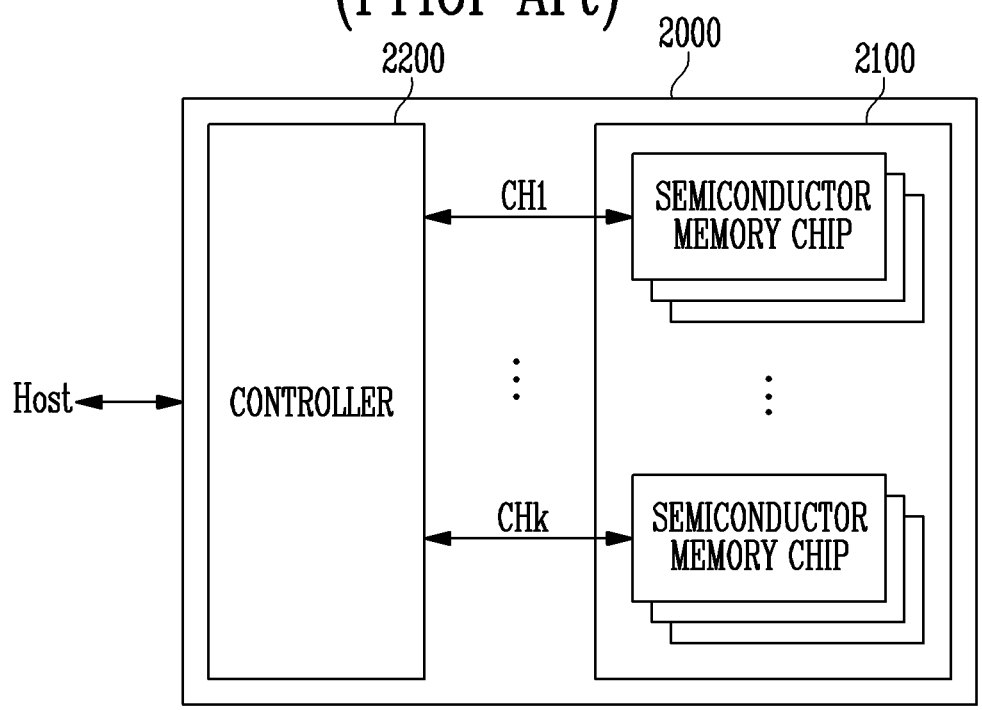
FIG. 16 is a block diagram illustrating an example of application of the memory system of FIG. 15.

FIG. 16 is a block diagram illustrating an example of application of the memory system of FIG. 15 according to an embodiment of the present disclosure.

Referring to FIG. 16, the memory system 2000 may include the semiconductor memory device 2100 and a controller 2200. The semiconductor memory device 2100 may include a plurality of semiconductor memory chips. The semiconductor memory chips are divided into a plurality of groups.

In FIG. 16, it is illustrated that the plurality of groups communicate with the controller 2200 through first to k-th channels CH1 to CHk. Each semiconductor memory chip may be configured and operated in the same manner as those of the semiconductor memory device 100 described with reference to FIG. 1.

Each group may communicate with the controller 2200 through one common channel. The controller 2200 may have the same configuration as the controller 1100 described with reference to FIG. 15, and may control the plurality of memory chips of the semiconductor memory device 2100 through the plurality of channels CH1 to CHk.

FIG. 17 is a block diagram illustrating a computing system including the memory system described with reference to FIG. 16 according to an embodiment of the present disclosure.

A computing system 3000 includes a central processing unit (CPU) 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 17, a semiconductor memory device 2100 is illustrated as being coupled to the system bus 3500 through the controller 2200. However, the semiconductor memory device 2100 may be directly coupled to the system bus 3500. Here, the function of the controller 2200 may be performed by the CPU 3100 and the RAM 3200.

In FIG. 17, the memory system 2000 described with reference to FIG. 16 is illustrated as being provided. However, the memory system 2000 may be replaced with the memory system 1000 described with reference to FIG. 15. In an embodiment, the computing system 3000 may include both the memory systems 1000 and 2000 described with reference to FIGS. 15 and 16.

The present disclosure may provide a semiconductor memory device, which may enhance the reliability of a program operation, and a method of operating the semiconductor memory device.

Moreover, the embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. The embodiments may be combined to form additional embodiments.

Furthermore, the embodiments disclosed in the present specification and the drawings aim to help those with ordinary knowledge in this art more clearly understand the present disclosure rather than aiming to limit the bounds of the present disclosure. Therefore, one of ordinary skill in the art to which the present disclosure belongs will be able to easily understand that various modifications are possible based on the technical scope of the present disclosure and the following claims.

What is claimed is:

1. A semiconductor memory device comprising:
    a memory cell array including a plurality of memory cells;
    a peripheral circuit configured to perform a program operation on selected memory cells coupled to a selected word line among the plurality of memory cells, the program operation comprising a plurality of program loops, each of the plurality of program loops comprising a program phase and a verify phase, the verify phase including one or more verify operations; and
    a control logic configured to control the program operation of the peripheral circuit, the control logic comprising a verify operation counter configured to count a multiple number of the verify operations whose verify voltages are different from each other, performed by the peripheral circuit in the verify phase included in one of the plurality of program loops during the program operation.

2. The semiconductor memory device according to claim 1, wherein the control logic is further configured to determine whether the number of the verify operations is greater than a set maximum number of verify operations.

3. The semiconductor memory device according to claim 2, wherein the control logic is further configured to, when the number of the verify operations is greater than the set maximum number of verify operations, determine that the program operation has failed.

4. The semiconductor memory device according to claim 2, wherein the control logic is further configured to, when the number of the verify operations is not greater than the set maximum number of verify operations, control the peripheral circuit so that a subsequent program loop of the plurality of program loops is performed during the program operation.

5. The semiconductor memory device according to claim 2, wherein the control logic further comprises:
    a maximum-number-of-verify-operations storage configured to store the set maximum number of verify operations; and
    an excessive verify operation detector configured to compare the number of the verify operations performed in the program loop with the set maximum number of verify operations.

6. The semiconductor memory device according to claim 2, wherein the control logic is further configured to, when the number of the verify operations is not greater than the set maximum number of verify operations, determine whether the verify operations corresponding to all program states have passed.

7. The semiconductor memory device according to claim 6, wherein the control logic is further configured to, when the verify operations corresponding to all program states have passed, determine that the program operation has succeeded.

8. The semiconductor memory device according to claim 6, wherein the control logic is further configured to, when the verify operations corresponding to all program states have not passed, determine whether a current number of program loops has reached a maximum number of program loops.

9. The semiconductor memory device according to claim 8, wherein the control logic is further configured to, when the current number of program loops has reached the maximum number of program loops, determine that the program operation has failed.

10. The semiconductor memory device according to claim 8, wherein the control logic is further configured to, when the current number of program loops has not reached the maximum number of program loops, control the peripheral circuit so that a subsequent program loop of the plurality of program loops is performed during the program operation.

11. A method of operating a semiconductor memory device including a plurality of memory cells, the method comprising performing a program operation of programming memory cells coupled to a selected word line among the plurality of memory cells,
    wherein the program operation includes a plurality of program loops and each of the plurality of program loops comprises:
    applying a program voltage to the selected word line;
    performing one or more verify operations respectively corresponding to one or more program states on memory cells coupled to the selected word line; and
    counting a multiple number of the verify operations at increasing verify voltages that are performed in a current program loop.

12. The method according to claim 11, wherein the program loop further comprises determining whether the counted number of the verify operations is greater than a set maximum number of verify operations.

13. The method according to claim 12, wherein the program loop further comprises determining that the program operation has failed in response to a determination indicating that the counted number of the verify operations is greater than the maximum number of verify operations.

14. The method according to claim 12, wherein the program loop further comprises determining whether the verify operations corresponding to all program states have passed in response to a determination indicating that the counted number of the verify operations is not greater than the maximum number of verify operations.

15. The method according to claim 14, wherein the program loop further comprises determining that the program operation has succeeded in response to the determination indicating that the verify operations corresponding to all program states have passed.

16. The method according to claim 14, wherein the program loop further comprises determining whether a current number of program loops has reached a maximum number of program loops in response to the determination indicating that the verify operations corresponding to all program states have not passed.

17. The method according to claim 16, wherein the program loop further comprises determining that the program operation has failed in response to the determination indicating that the current number of program loops has reached the maximum number of program loops.

18. The method according to claim 16, wherein the program loop further comprises determining that a subsequent program loop to the program loop is to be performed in response to the determination indicating the current number of program loops has not reached the maximum number of program loops.

19. The method according to claim 11, wherein the performing the verify operations respectively corresponding to the program states on the memory cells coupled to the selected word line comprises applying verify voltages respectively corresponding to the program states to the selected word line.

20. A semiconductor memory device, comprising:
a memory cell array including a plurality of memory cells;
a peripheral circuit configured to perform a program operation on selected memory cells coupled to a selected word line among the plurality of memory cells, the program operation comprising a plurality of program loops, each of the plurality of program loops comprising a program phase and a verify phase, the verify phase including one or more verify operations; and
a control logic configured to control the program operation of the peripheral circuit, the control logic comprising:
a verify operation counter configured to count a multiple number of the verify operations whose verify voltages are different from each other, performed by the peripheral circuit in one of the plurality of program loops during the program operation;
a maximum-number-of-verify-operations storage configured to store a maximum number of verify operations; and
an excessive verify operation detector configured to compare the number of the verify operations performed in the program loop with the maximum number of verify operations, and determine whether the program operation has succeeded based on a result of the comparison.

* * * * *